United States Patent [19]

Seki et al.

[11] Patent Number: 4,600,917
[45] Date of Patent: Jul. 15, 1986

[54] GATE-TURN-OFF THYRISTOR FAILURE DETECTING CIRCUIT

[75] Inventors: Nagataka Seki, Fuchu; Shunichi Koike, Ichikawa; Yukio Watanabe, Fuchu, all of Japan

[73] Assignee: Tokyo Shibaura Denki Kabushiki Kaisha, Japan

[21] Appl. No.: 547,254

[22] Filed: Oct. 31, 1983

[30] Foreign Application Priority Data

Oct. 30, 1982 [JP] Japan .................. 57-191463

[51] Int. Cl.[4] .............................. G08B 21/00
[52] U.S. Cl. .................. 340/645; 307/252 L; 324/158 SC; 363/54; 363/68
[58] Field of Search .............. 340/645, 653; 363/68, 363/54; 324/158 SC, 158 D, 119; 307/252 L, 252 C, 252 M

[56] References Cited

U.S. PATENT DOCUMENTS

| 3,277,371 | 10/1966 | Marcus et al. ...................... 324/158 |
| 3,962,624 | 6/1976 | Ostlund et al. ............. 307/252 L X |
| 4,084,221 | 4/1978 | Ogato ..................................... 363/54 |
| 4,100,434 | 7/1978 | Iyotani et al. ................... 307/252 L |
| 4,203,047 | 9/1978 | Seki ................................ 307/252 C |
| 4,223,236 | 9/1980 | Iyotani et al. ............. 307/252 L X |
| 4,371,909 | 2/1983 | Kano ................................. 363/68 X |

FOREIGN PATENT DOCUMENTS 2012032 9/1978 Fed. Rep. of Germany .

Primary Examiner—James L. Rowland
Assistant Examiner—Daniel Myer
Attorney, Agent, or Firm—Finnegan, Henderson, Farabow, Garrett & Dunner

[57] ABSTRACT

A gate-turn-off thyristor failure detecting circuit includes a detector which detects an off-gate signal for a gate-turn-off thyristor and a current level detector which compares the signal with a predetermined value and produces an output signal indicative of the failure of the gate-turn-off thyristor.

8 Claims, 4 Drawing Figures

GATE-TURN-OFF THYRISTOR FAILURE DETECTING CIRCUIT

BACKGROUND OF THE INVENTION

This invention relates to a failure detecting circuit for gate-turn-off thyristors that detects short-circuit failures of gate-turn-off thyristors at the gate circuits thereof.

Hitherto, a short-circuit failure of a gate-turn-off thyristor (hereinafter "GTO thyristor") has been determined by detecting a short-circuit current or a voltage drop between the anode and cathode of the GTO thyristor. However, plural GTO thyristors often are connected to each other in series. If one of the GTO thyristors breaks down, it does not cause a short-circuit current to flow. Accordingly, the voltage across the assembly of serially connected GTO thyristors does not become low.

In order to detect a failure in serially connected GTO thyristors, a circuit as shown in FIG. 1 has been utilized. In FIG. 1, reference numerals 11 through 16 represent GTO thyristors. In this case, six GTO thyristors are connected in series. Reference numerals 17 and 18 represent voltage-dividing resistors, and 19 a current detector, respectively. When all the GTO thyristors 11 through 16 are in normal operation, a voltage between points C and B is half of a voltage between points A and B. Similarly, a voltage between points D and B is half of the voltage between points A and B. In this event, the potentials at points C and D are equivalent, so that there exists no current flow between points C and D.

When a GTO thyristor in the group 11, 12, 13, such as GTO thyristor 11, experiences a short-circuit failure, the voltage between points C and B rises to greater than half of the voltage between points A and B. Consequently, a current flows from point C to point D. A current detector 19 is connected between points C and D. If current detector 19 detects the current that flows from point C to point D, a GTO thyristor in the group 11, 12, 13 is judged as having failed. On the other hand, when a GTO thyristor in the group 14, 15, 16, such as GTO thyristor 14, experiences a short-circuit failure, a current flows from point D to point C. If current detector 19 detects this current, the failure of a GTO thyristor in group 14, 15, 16 is determined.

In the aforementioned conventional method, a failure of a GTO thyristor element is detected by the difference between the voltage across points A and C and that across points C and B. In this method, there is a disadvantage described below. When the number of the GTO thyristors between points A and C in short-circuit failure is equal to that of the GTO thyristors between points C and B in short-circuit failure, the failure of such GTO thyristors cannot be detected, in principle.

Furthermore, as the number of serially connected GTO thyristors becomes large, resistors 17, 18 which will withstand higher voltages are inevitably required.

SUMMARY OF THE INVENTION

It is therefore an object of this invention to provide a GTO thyristor failure detecting circuit capable of detecting a failure of a GTO thyristor at the gate circuit thereof without any modifications in the main circuit, and of detecting failures that occur in any one of a group of interconnected GTO thyristors.

According to this invention, a gate-turn-off thyristor failure detecting circuit comprises a pulse amplifier for amplifying an off-gate signal, a pulse transformer having primary and secondary windings, the primary winding being connected to the pulse amplifier, a gate pulse synthesizing circuit for producing a gate pulse which is applied to a gate of the gate-turn-off thyristor, the gate pulse synthesizing circuit being connected to the secondary winding of the pulse transformer, means for detecting a signal flowing through the primary winding of the pulse transformer, and means for comparing the output signal from the detecting means with a predetermined value for producing a signal indicative of the failure of the gate-turn-off thyristor.

The accompanying drawings, which are incorporated in, and constitute a part of, this specification, illustrate two embodiments of the invention and, together with the description, serve to explain the principles of the invention.

DETAILED DESCRIPTION OF THE INVENTION

Figure 1:
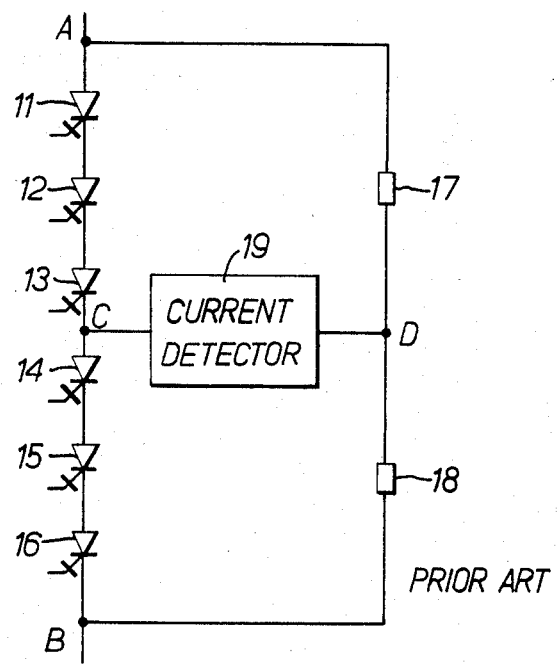
FIG. 1 is a schematic diagram illustrating a conventional failure detecting circuit for serially connected GTO thyristors.
Figure 2:
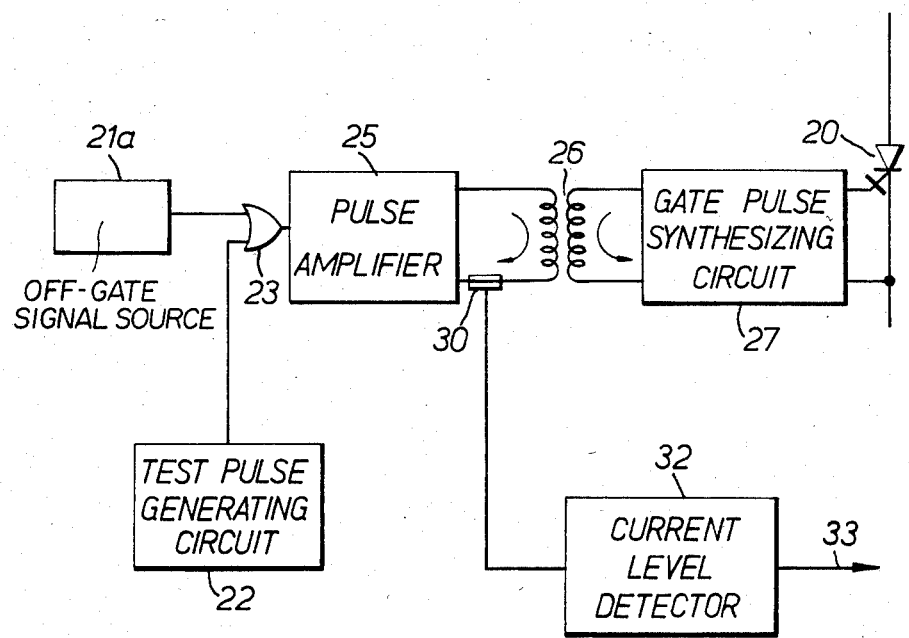
FIG. 2 is a block diagram illustrating one embodiment of the gate-turn-off thyristor failure detecting circuit according to this invention.

One embodiment according to this invention is shown in FIG. 2. Referring to FIG. 2, reference numeral 20 represents a GTO thyristor. An off-gate signal is applied to a pulse amplifier 25 from source 21a through an OR gate circuit 23. A test pulse from a test pulse generating circuit 22 is also applied to the other terminal of OR gate circuit 23. An output signal from pulse amplifier 25 is applied to a primary winding of an off-gate pulse transformer 26. The off-gate pulse from a secondary winding of pulse transformer 26 is applied to a gate pulse synthesizing circuit 27. Gate pulse synthesizing circuit 27 functions to synthesize the off-gate pulse from pulse transformer 26, an on-gate pulse (not shown) for GTO thyristor 20, and a negative bias signal (not shown). The gate pulse synthesizing circuit 27 produces a gate pulse which is applied to a gate of the GTO thyristor 20.

A current detector 30 detects a current flowing through the primary winding of pulse transformer 26. An output voltage signal from current detector 30 is applied to a current level detector 32. Current level detector 32 compares the output voltage signal with a predetermined value. When the voltage signal is equal to or larger than the predetermined value, current level detector 32 produces a GTO thyristor failure signal at 33.

Figure 3:
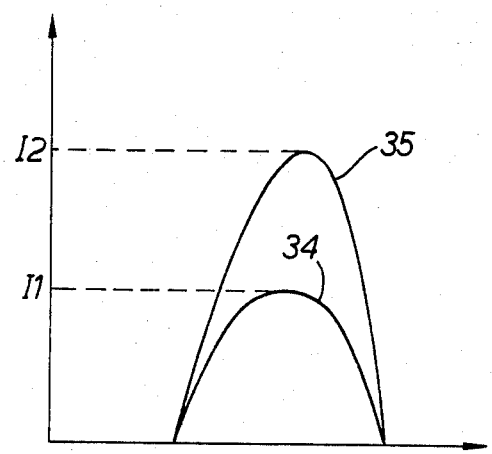
FIG. 3 is a characteristic diagram for explaining the principle of this invention.

Referring to FIG. 3, reference numeral 34 represents the primary current of pulse transformer 26. The primary current 34 flows through the primary windings of pulse transformer 26 when GTO thyristor 20 is operating normally. In FIG. 3, the abscissa represents time, and the ordinate, current, respectively. In normal operation, the GTO thyristor has a certain value of impedance between the gate and the cathode of the GTO thyristor. When the GTO thyristor breaks down, the impedance between the gate and the cathode of the GTO thyristor becomes extremely small. In such a case, the primary current of pulse transformer 26 increases as shown by waveform 35 illustrated in FIG. 3. The predetermined value of current level detector 32 is established between the peak value $I_1$ of current waveform 34 and the peak value $I_2$ of current waveform 35. In current level detector 32, the voltage signal 31 is compared with the predetermined value and the "normal" or "failure" status of the GTO thyristor is ascertained.

Before the main circuit composed of the GTO thyristors is energized, a test pulse initiating from test pulse generating circuit 22 is applied to each of the GTO thyristors and the failure of any one or more of them can be detected as explained above. During the operation of the main circuit, the failure of the GTO thyristor can also be instantaneously detected by applying off-gate signal to pulse amplifier 25. The off-gate current of the GTO thyristor corresponds to the magnitude of the off-gate signal flowing through the primary winding of pulse transformer 26.

It is preferable that the voltage of the off-gate pulse applied to the gate of the GTO thyristor is lowered when examining the GTO thyristor. When the voltage of the off-gate pulse is set below the reverse breakdown voltage between the gate and the cathode of the GTO thyristor, the gate current in normal operation is almost negligible. Accordingly, it is easy to determine whether the GTO thyristor has failed or not.

Figure 4:
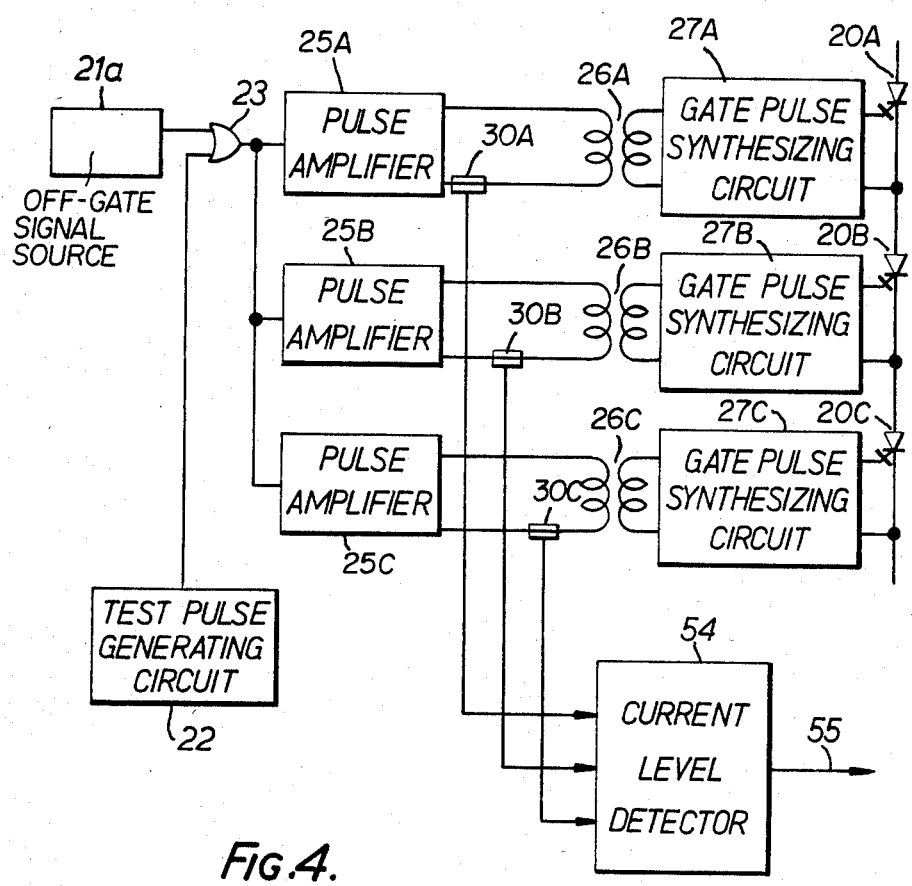
FIG. 4 is a block diagram to which this invention is adapted for a circuit with a number of GTO thyristors in series connection.

Another embodiment according to this invention is shown in FIG. 4 wherein similar parts as shown in FIG. 2 are designated by like reference numerals.

Referring to FIG. 4, reference numerals 25A, 25B and 25C represent pulse amplifiers, 26A, 26B and 26C pulse transformers, 27A, 27B and 27C gate pulse synthesizing circuits, and 20A, 20B and 20C GTO thyristors, respectively, and which parts have the identical function as the respective parts in the embodiment shown in FIG. 2. Current detectors 30A, 30B and 30C convert off-gate currents of the GTO thyristors 20A, 20B and 20C into respective voltage signals. A current level detector 54 detects failures of the individual GTO thyristors in accordance with the magnitude of the voltage signals produced by the current detectors as compared to a reference value so as to produce a failure signal upon failure of one or more GTO thyristors. When a failure of a particular GTO thyristor is to be detected, each of the voltage signals produced by the current detectors is compared with the predetermined reference value. When a failure of any one of the assembly of GTO thyristors 20A, 20B, 20C is to be detected, the level detection should be performed such that the voltage signals from the current detectors are fed through a maximum value select circuit such as a diode OR circuit (not shown) and the maximum voltage signal is compared with the predetermined reference value. The level detection can be achieved by using only a single circuit independent of the number of series-connected GTO thyristors. In the case of parallel-connected GTO thyristors, level detection can be achieved in a similar manner.

As described above, in accordance with this invention, without any modifications of the main circuit, and further, prior to energizing the main circuit, a short-circuit failure of a GTO thyristor can be detected based on the magnitude of the off-gate current at the gate circuit thereof. Furthermore, even when plural GTO thyristors are utilized in serial or parallel connections, failure detection can be achieved using the failure detecting circuit of the present invention merely by the further addition of other, conventional circuits.

What is claimed is:

1. A gate-turn-off thyristor failure detecting circuit comprising:
   an off-gate signal source;
   a pulse amplifier connected to said off-gate signal source for amplifying the off-gate signal;
   a pulse transformer having primary and secondary windings, said primary winding being connected to said pulse amplifier;
   a gate pulse synthesizing circuit for producing a gate pulse which is applied to a gate of the gate-turn-off thyristor, said gate pulse synthesizing circuit being connected to said secondary winding of said pulse transformer;
   means for detecting a signal flowing through said primary winding of said pulse transformer; and
   means for comparing the output signal from said detecting means with a predetermined value to produce an output signal from said comparing means indicative of the failure of the gate-turn-off thyristor.

2. The gate-turn-off thyristor failure detecting circuit according to claim 1 further comprising:
   circuit means for generating a test off-gate signal, said generating cirucit means being connected to the primary winding of said pulse amplifier.

3. The gate-turn-off thyristor failure detecting circuit according to claim 2 wherein said off-gate signal source and said test off-gate signal generating means are connected to said pulse amplifier through an OR circuit.

4. The gate-turn-off thyristor failure detecting circuit according to claim 1 wherein said signal detecting means is a current detector.

5. The gate-turn-off thyristor failure detecting circuit according to claim 1 wherein said gate pulse synthesizing circuit also receives an on-gate pulse signal and a bias signal.

6. A gate-turn-off thyristor failure detecting circuit for detecting the failure of one or more units in a plurality of interconnected gate-turn-off thyristors, the circuit comprising:
   an off-gate signal source;
   a plurality of pulse amplifiers each connected to said off-gate signal source for amplifying the off-gate signal;
   a plurality of pulse tansformers each having primary and secondary windings, each of said primary windings being connected to a different one of said pulse amplifiers;
   a plurality of gate pulse synthesizing circuits each for producing a gate pulse which is applied to a gate of a different one of the interconnected gate-turn-off thyristors, each of said gate pulse synthesizing circuits being connected to the secondary winding of a different one of said pulse transformers;
   a plurality of means for detecting a signal flowing through said primary winding of a different one of said pulse transformers; and
   means connected with each of said plurality of detecting means for comparing the output signals from said plurality of detecting means with a predetermined value to produce an output signal from said comparing means indicative of the failure of one or more gate-turn-off thyristors.

7. The gate-turn-off thyristor failure detecting circuit according to claim 6 further comprising:
cirucit means for generating a test off-gate signal, said generating circuit means being connected to the primary windings of each of said pulse amplifiers.
8. The gate-turn-off thyristor failure detecting circuit according to claim 6 wherein said off-gate signal source and said test off-gate signal generating means are connected to the primary windings of each of said pulse amplifiers through an OR circuit.

* * * * *